United States Patent
Lin

(10) Patent No.: US 11,060,799 B1
(45) Date of Patent: Jul. 13, 2021

(54) VAPOR CHAMBER STRUCTURE

(71) Applicant: TAIWAN MICROLOOPS CORP., New Taipei (TW)

(72) Inventor: Chun-Hung Lin, New Taipei (TW)

(73) Assignee: TAIWAN MICROLOOPS CORP., New Taipei (TW)

( * ) Notice: Subject to any disclaimer, the term of this patent is extended or adjusted under 35 U.S.C. 154(b) by 0 days.

(21) Appl. No.: 16/828,919

(22) Filed: Mar. 24, 2020

(51) Int. Cl.
*F28D 15/04* (2006.01)
*F28D 15/02* (2006.01)
*H05K 7/20* (2006.01)
*H01L 23/427* (2006.01)

(52) U.S. Cl.
CPC ....... *F28D 15/046* (2013.01); *F28D 15/0233* (2013.01); *H01L 23/427* (2013.01); *H05K 7/20336* (2013.01); *H05K 7/20436* (2013.01); *H05K 7/20472* (2013.01); *H05K 7/20509* (2013.01)

(58) Field of Classification Search
CPC . F28D 15/046; F28D 15/0233; H01L 23/427; H05K 7/20509; H05K 7/20336; H05K 7/20436; H05K 7/20472
USPC .................................................... 165/104.26
See application file for complete search history.

(56) References Cited

U.S. PATENT DOCUMENTS

| | | | | |
|---|---|---|---|---|
| 8,136,581 B2* | 3/2012 | Tonosaki | ............... | F28D 15/043 165/104.26 |
| 2007/0107875 A1* | 5/2007 | Lee | ........................ | H01L 23/427 165/104.26 |
| 2007/0163755 A1* | 7/2007 | Kim | ........................ | H01L 23/427 165/104.26 |
| 2009/0040726 A1* | 2/2009 | Hoffman | ............. | F28D 15/0233 361/700 |
| 2010/0307003 A1* | 12/2010 | Hoffman | ............... | F28D 15/046 29/890.032 |
| 2013/0337169 A1* | 12/2013 | Chen | .................... | C23C 18/1216 427/240 |
| 2019/0186842 A1* | 6/2019 | Chiang | ..................... | C25D 7/00 |

FOREIGN PATENT DOCUMENTS

| | | |
|---|---|---|
| CN | 109874269 A | 6/2019 |
| TW | M443873 U1 | 12/2012 |

OTHER PUBLICATIONS

Office Action dated Apr. 29, 2020 of the corresponding Taiwan patent application No. 109105437.
Office Action dated Oct. 26, 2020 of the corresponding Taiwan patent application No. 109105437.

* cited by examiner

*Primary Examiner* — Joel M Attey
(74) *Attorney, Agent, or Firm* — Chun-Ming Shih; HDLS IPR Services

(57) ABSTRACT

A vapor chamber structure includes a thin-sheet housing with a hollow interior and a composite capillary layer installed in the thin-sheet housing. The composite capillary layer is a metal woven mesh formed by weaving plural metal filaments, and each metal filament of the composite capillary layer is a steel wire having a coating layer on the exterior of the steel wire. By pulling and drawing the steel into a linear shape, a smaller wire diameter is obtained, so that the composite capillary layer will not be broken easily and can be used for making a finer woven mesh which can be installed in a thinner vapor chamber.

6 Claims, 4 Drawing Sheets

VAPOR CHAMBER STRUCTURE

BACKGROUND OF THE INVENTION

1. Technical Field

The technical field relates to a vacuum heat transfer element, and more particularly to an improved vapor chamber structure.

2. Description of Related Art

Since the computing power of various electronic products keeps improving, and thermal dissipation becomes an issue, therefore vapor chambers (also known as flat heat pipes) are indispensable heat dissipating components.

However, electronic products tend to be designed with a light and thin design, so that the vapor chamber (or flat heat pipe) has to be thin. Therefore, the capillary effect of a capillary tissue in the vapor chamber will be affected by the requirement for the thin design. If a thin material used for the capillary tissue cannot be found, it will be difficult to meet the requirement for the thin design and the vapor chamber (or flat heat pipe) will not be suitable for the thin design of the electronic products.

In view of the aforementioned drawback of the conventional vapor chamber, the discloser of this disclosure based on years of experience in the related industry to conduct extensive research and experiment, and finally provided a feasible solution to overcome the drawbacks of the prior art.

SUMMARY OF THE INVENTION

Therefore, it is a primary object of this disclosure to provide a vapor chamber structure having a capillary structure comprised of steel wires and formed in the vapor chamber, and when the steel is pulled and drawn into a linear shape, a smaller wire diameter is obtained, so that the composite capillary layer will not be broken easily and can be used for making a finer woven mesh which can be installed in a thinner vapor chamber.

Another objective of this disclosure is to provide a vapor chamber structure having a coating layer coated outside the steel wire to achieve the effect of preventing the steel wire from being corroded by the working fluid inside the vapor chamber.

To achieve the aforementioned and other objectives, this disclosure provides a vapor chamber structure, comprising: a thin-sheet housing with an interior substantially in a hollow form; and a composite capillary layer, disposed in the thin-sheet housing; wherein, the composite capillary layer is a metal woven mesh and formed by weaving a plurality of metal filaments, and each metal filament of the composite capillary layer is a steel wire having a coating layer disposed on the external surface thereof.

DESCRIPTION OF THE PREFERRED EMBODIMENTS

The technical contents of this disclosure will become apparent with the detailed description of preferred embodiments accompanied with the illustration of related drawings as follows. It is intended that the embodiments and drawings disclosed herein are to be considered illustrative rather than restrictive.

Figure 1:
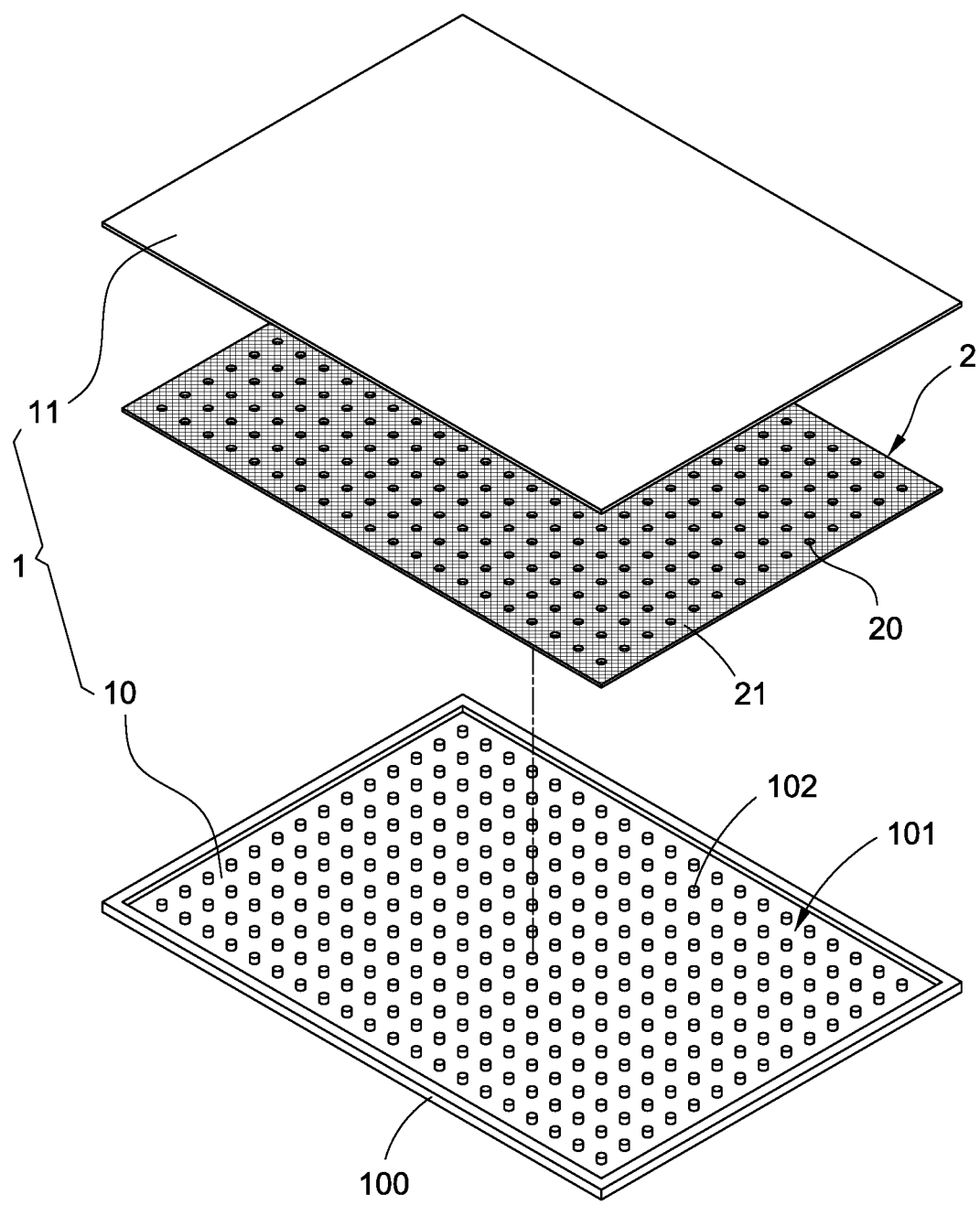
FIG. 1 is an exploded view of a vapor chamber structure in accordance with a first embodiment of this disclosure.
Figure 2:
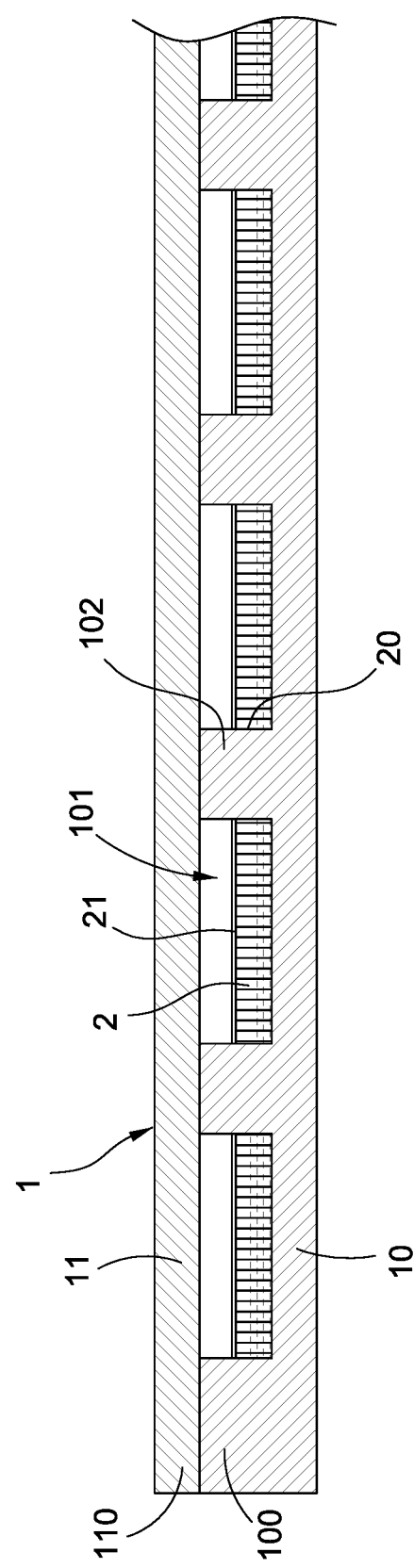
FIG. 2 is a cross-sectional view of a vapor chamber structure in accordance with the first embodiment of this disclosure.

With reference to FIGS. 1 and 2 for the exploded view and partial cross-sectional view of a vapor chamber structure in accordance with the first embodiment of this disclosure respectively, the vapor chamber structure comprises a thin-sheet housing 1, and a composite capillary layer 2 disposed in the thin-sheet housing 1.

The thin-sheet housing 1 has an interior substantially in a hollow form and is made of copper or aluminum, and the thin-sheet housing 1 is formed by covering a first plate 10 and a second plate 11 with each other. In the first embodiment of this disclosure, the first plate 10 has a first recessed space 101 continuously formed around the periphery of the first sealing edge 100 and enclosed by the first plate 10 and the first sealing edge 100, and the second plate 11 is covered onto the first sealing edge 100 to seal the first recessed space 101, so as to form the thin-sheet housing 1. In addition, the first recessed space 101 is formed by etching a surface of the first plate 10 to be indented inwardly into the surface, and a non-etched portion is reserved inside the first recessed space 101 for forming a plurality of first support portions 102 and provided for the second plate 11 to seal the first recessed space 101 and stack onto the first plate 10, so that the first support portions 102 can abut against the inner surface of the second plate 11 to serve as a support structure.

The composite capillary layer 2 is disposed in the thin-sheet housing 1. In the first embodiment of this disclosure, the composite capillary layer 2 is disposed in the first recessed space 101. The composite capillary layer 2 of this disclosure is a metal woven mesh formed by weaving a plurality of metal filaments, wherein each metal filament of the composite capillary layer 2 is a steel wire with coating layer 21 coated onto the steel wire. When the steel is pulled and drawn into a linear shape, a smaller wire diameter is obtained, so that the composite capillary layer will not be broken easily and can be used for making a finer woven mesh which can be installed in a thinner vapor chamber, while maintaining the necessary capillary force of the composite capillary layer 2. In addition, the coating layer 21 is coated onto the steel wire, and the coating is made of titanium. Before each steel wire is woven into the capillary layer 2 of the woven mesh, the coating layer 21 is coated first; or after each steel wire is woven into the capillary layer 2 of the woven mesh, the coating layer 21 is coated onto the capillary layer 2, so as to ensure the composite capillary layer 2 formed by the steel wire can provide the required capillary force, while the composite capillary layer 2 is prevented from being corroded by the working fluid and an anti-rust effect is achieved.

In FIG. 2, the composite capillary layer 2 of this disclosure further comprises a plurality of positioning holes 20 configured to be corresponsive to the first support portions 102 respectively and provided for fixing the composite capillary layer 2 into the first recessed space 101 of the first plate 10 and attaching the composite capillary layer 2 onto an inner surface of the first plate 10 closely. The aforementioned structural assembly constitutes the vapor chamber structure of this disclosure.

Figure 3:
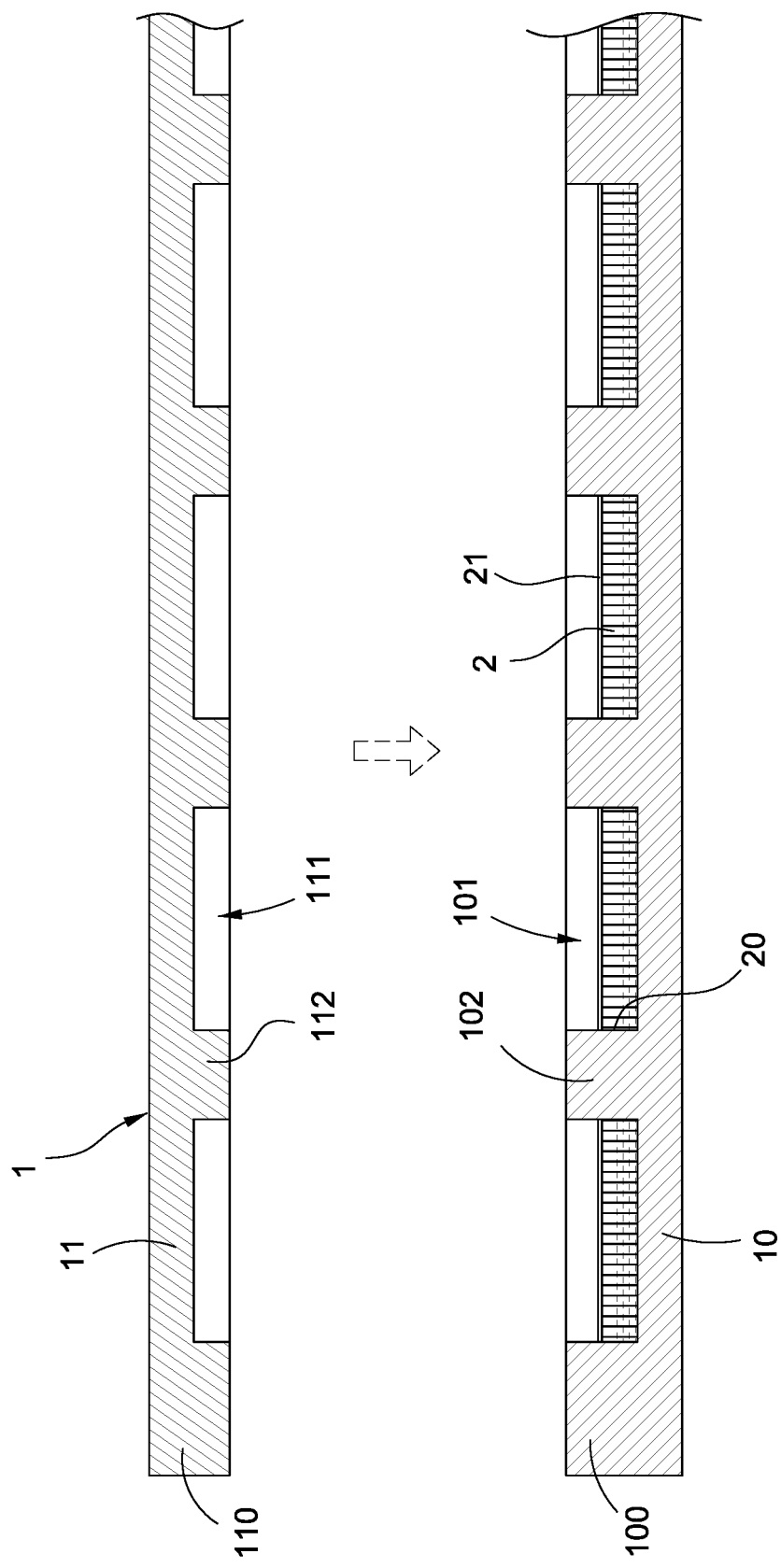
FIG. 3 is a partial cross-sectional view of a vapor chamber structure in accordance with a second embodiment of this disclosure.
Figure 4:
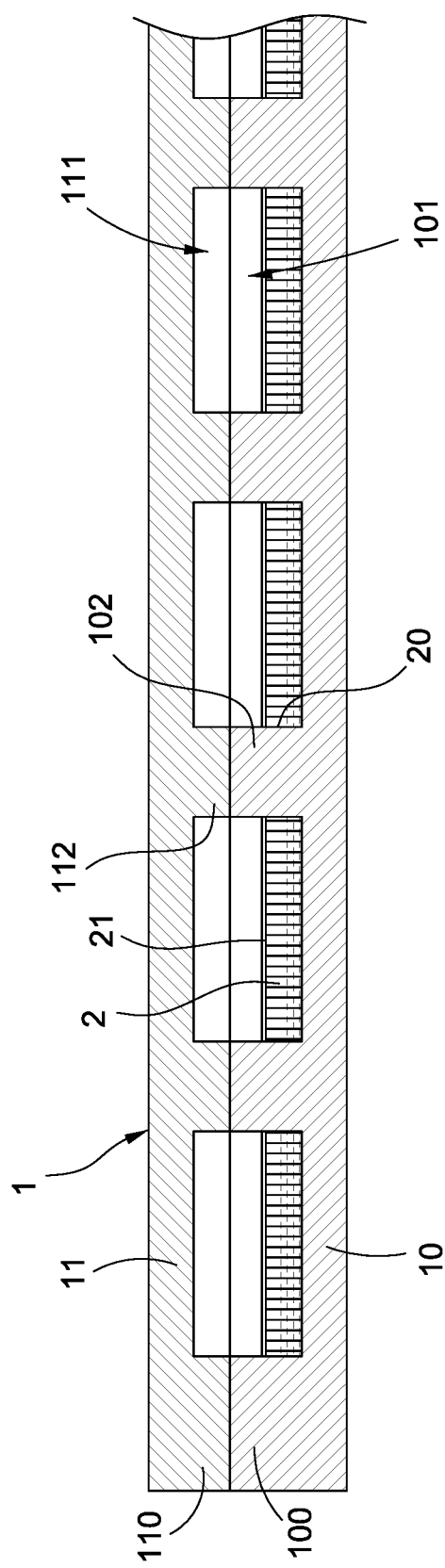
FIG. 4 is a partial cross-sectional view of a vapor chamber structure in accordance with the second embodiment of this disclosure.

In the second embodiment of this disclosure as shown in FIGS. 3 and 4, the second plate 11 of the thin-sheet housing 1 further has a second recessed space 111 continuously formed around the periphery of the second sealing edge 110 and enclosed by the second plate 11 and the second sealing edge 110, when the second plate 11 and the first plate 10 are covered with each other, the first and second sealing edges 100, 110 of the first and second plates 10, 11 are engaged closely to seal the first and second recessed spaces 101, 111, so as to provide another feasible implementation mode of the thin-sheet housing 1. In addition, the second recessed space 111 can also be formed by etching a surface of the second plate 11 to be recessed inwardly, and a non-etched portion is reserved in the second recessed space 111 for forming a plurality of second support portions 112. When the non-etched portion is provided for covering the first plate 10, the first support portions 102 and the second support portion 112 abut against each other to serve as a support structure.

In summation of the description above, this disclosure definitely can achieve the expected objectives and overcome the drawbacks of the prior art, and the disclosure complies with the patent application requirements, and thus is duly filed for patent application.

While this disclosure has been described by means of specific embodiments, numerous modifications and variations could be made thereto by those skilled in the art without departing from the scope and spirit of this disclosure set forth in the claims.

What is claimed is:

1. A vapor chamber structure, comprising:
   a housing, with an interior substantially in a hollow form and comprising a first plate and a second plate, the first plate comprising a plurality of first support portions and the second plate comprising a plurality of second support portions, wherein the first support portions and the first plate are in a single piece form, and the second support portions and the second plate are in a single piece form; and
   a composite capillary layer, disposed on the first plate, and the second plate being free from the composite capillary layer;
   wherein, the composite capillary layer is a metal woven mesh and formed by weaving a plurality of metal filaments, and each metal filament of the composite capillary layer is a steel wire having a coating layer disposed on the external surface thereof, each of the first support portions comprises a first upper surface and a plurality of first upper surfaces are coplanar, and each of the second support portions comprises a second upper surface and a plurality of second upper surfaces are coplanar, and the first upper surfaces and the second upper surfaces are coplanar, and the coating layer is made of titanium.

2. The vapor chamber structure as claimed in claim 1, wherein the housing is made of copper or aluminum.

3. The vapor chamber structure as claimed in claim 1, wherein the first plate has a first recessed space continuously formed around the periphery of the first sealing edge and enclosed by the first plate and the first sealing edge, and the second plate is covered onto the first sealing edge to seal the first recessed space.

4. The vapor chamber structure as claimed in claim 3, wherein the first recessed space is formed by an etching method.

5. The vapor chamber structure as claimed in claim 3, wherein the second plate has a second recessed space continuously formed around the periphery of the second sealing edge and enclosed by the second plate and the second sealing edge.

6. The vapor chamber structure as claimed in claim 1, wherein the coating layer is formed by a coating method.

\* \* \* \* \*